US008994177B2

(12) United States Patent
Barwicz et al.

(10) Patent No.: US 8,994,177 B2
(45) Date of Patent: Mar. 31, 2015

(54) FAR BACK END OF THE LINE STACK ENCAPSULATION

(71) Applicant: International Business Machines Corporation, Armonk, NY (US)

(72) Inventors: Tymon Barwicz, Yorktown Heights, NY (US); Robert L. Bruce, White Plains, NY (US); Swetha Kamlapurkar, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/967,986

(22) Filed: Aug. 15, 2013

(65) Prior Publication Data

US 2014/0151898 A1 Jun. 5, 2014

Related U.S. Application Data

(63) Continuation of application No. 13/693,749, filed on Dec. 4, 2012.

(51) Int. Cl.
*H01L 23/48* (2006.01)
*H01L 23/52* (2006.01)
(Continued)

(52) U.S. Cl.
CPC ...... *H01L 23/3157* (2013.01); *H01L 21/76877* (2013.01); *H01L 23/3192* (2013.01); *H01L 2924/0002* (2013.01)
USPC ........... 257/754; 257/396; 257/774; 257/787; 257/E21.006; 257/E21.007; 257/E21.027; 257/E21.058; 257/E21.077; 257/E21.182; 257/E21.218; 257/E21.221; 257/E21.246; 257/E21.259; 257/E21.545; 257/E21.549

(58) Field of Classification Search
USPC ......... 257/750, 774, 787, 796, 347, 396, 717, 257/649, E21.006, E21.007, E21.027, 257/E21.058, E21.077, E21.182, E21.218, 257/E21.221, E21.246, E21.259, E21.545, 257/E21.549
See application file for complete search history.

(56) References Cited

U.S. PATENT DOCUMENTS 6,949,459 B2 9/2005 Li et al.
7,049,221 B2 5/2006 Deguchi
(Continued)

OTHER PUBLICATIONS

O'Connor, J. "Analytical Predictions of Thermal Stress in Mosfets" Aerospace Applications Conference, 1995 IEEE, Issue: 0, Part: 2. Feb. 1995. pp. 131-143.
(Continued)

*Primary Examiner* — David Nhu
(74) *Attorney, Agent, or Firm* — Tutunjian & Bitetto, P.C.; Vazken Alexanian

(57) ABSTRACT

A method for far back end of the line (FBEOL) protection of a semiconductor device includes forming a patterned layer over a back end of the line (BEOL) stack, depositing a first conformal protection layer on the patterned layer which covers horizontal surfaces of a top surface and sidewalls of openings formed in the patterned layer. A resist layer is patterned over the first conformal protection layer such that openings in the resist layer correspond with the openings in the patterned layer. The first conformal protection layer is etched through the openings in the resist layer to form extended openings that reach a stop position. The resist layer is removed, and a second conformal protection layer is formed on the first conformal protection layer and on sidewalls of the extended openings to form an encapsulation boundary to protect at least the patterned layer and a portion of the BEOL stack.

7 Claims, 7 Drawing Sheets

Form patterned layer or other structure over the BEOL stack to form openings 202
Form first conformal protection layer in openings 204
Pattern resist layer over the first conformal protection layer 206
Etch using the resist layer and the first conformal protection layer as a mask to extend the openings 208
Remove the resist layer 210
Form second conformal protection layer in extended openings 212
Etch a stop position in the extended openings 214
Form contacts 216
Perform wet etch or other processes with the devices with the device protected by an encapsulation boundary 218
Continue processing 220

(51) Int. Cl.

| | |
|---|---|
| ***H01L 29/40*** | (2006.01) |
| ***H01L 23/31*** | (2006.01) |
| ***H01L 21/768*** | (2006.01) |

(56) References Cited

U.S. PATENT DOCUMENTS

| | | | | |
|---|---|---|---|---|
| 7,329,613 | B2 | 2/2008 | Furukawa et al. | |
| 7,790,493 | B2 | 9/2010 | Wise et al. | |
| 8,030,707 | B2 | 10/2011 | Cheng et al. | |
| 8,263,492 | B2 | 9/2012 | Cotte et al. | |
| 8,309,462 | B1 * | 11/2012 | Yoshida et al. | 438/672 |
| 8,373,271 | B2 * | 2/2013 | Goldfarb et al. | 257/750 |
| 2011/0291284 | A1 | 12/2011 | Goldfarb et al. | |
| 2011/0316114 | A1 | 12/2011 | Viroomand et al. | |

OTHER PUBLICATIONS

Op De Beeck, M., et al. "An IC-Centric Biocompatible Chip Encapsulation Fabrication Process" Electronics System-Integration Technology Conference—ESTC 2010. Sep. 2010. (6 Pages).

* cited by examiner

FAR BACK END OF THE LINE STACK ENCAPSULATION

RELATED APPLICATION DATA

This application is a Continuation application of co-pending U.S. patent application Ser. No. 13/693,749 filed on Dec. 4, 2012, incorporated herein by reference in its entirety.

BACKGROUND

1. Technical Field

The present invention relates to semiconductor fabrication, and more particularly to device encapsulation to protect back end of line features.

2. Description of the Related Art

Processing of a semiconductor wafer is divided into different regimes or groups of steps. These regimes are commonly referred to as front-end-of-the-line (FEOL); middle-of-the-line (MOL) and back-end-of-the-line (BEOL). FEOL generally refers to the regime for forming devices on or in a semiconductor wafer, e.g., forming diffusion regions, active areas, etc. MOL is the regime where conductive structures are connected to the FEOL devices. BEOL is the regime for final wafer processing where an active region is connected to outside circuitry. BEOL materials are often porous and have poor resistance to wet etchant. Therefore, wet etching is usually never used in BEOL processing. In addition, thermal budget is strictly limited at BEOL to prevent damage to already-fabricated devices and the like. Once outer dielectric and polymer chip encapsulation layers are defined, the stack is referred to as a far back end of the line (FBEOL) stack. FBEOL is a sub-regime of BEOL.

SUMMARY

A method for far back end of the line (FBEOL) protection of a semiconductor device includes forming a patterned layer over a back end of line (BEOL) stack, depositing a first conformal protection layer on the patterned layer which covers horizontal surfaces of a top surface and sidewalls of openings formed in the patterned layer. A resist layer is patterned over the first conformal protection layer such that openings in the resist layer correspond with the openings in the patterned layer. The first conformal protection layer is etched through the openings in the resist layer to form extended openings that reach a stop position. The resist layer is removed, and a second conformal protection layer is formed on the first conformal protection layer and on sidewalls of the extended openings to form an encapsulation boundary to protect at least the patterned layer and a portion of the BEOL stack.

Another method for far back end of the line (FBEOL) protection of a semiconductor device includes forming first openings in a patterned layer over a back end of the line (BEOL) stack; depositing a first conformal protection layer on the patterned layer which covers horizontal surfaces of a top surface and sidewalls of the first openings formed in the patterned layer; patterning a resist layer over the first conformal protection layer to form second openings in the resist layer that correspond with the first openings in the patterned layer; etching the first conformal protection layer through the first and second openings to form extended openings that reach a stop position; removing the resist layer; depositing a second conformal protection layer on the first conformal protection layer and on sidewalls of the extended openings to form an encapsulation boundary; and wet etching during further processing such that the encapsulation boundary protects at least the patterned layer and a portion of the BEOL stack.

A semiconductor device having protected far back end of the line (FBEOL) structures includes a substrate, a front end of the line (FEOL) stack formed on the substrate, a BEOL stack formed over the FEOL stack. An encapsulation boundary is conformally formed over the BEOL stack covering horizontal surfaces and sidewalls of extended openings which extend into at least the BEOL stack to a stop position to protect at least a portion of the BEOL stack.

Another semiconductor device having protected far back end of the line (FBEOL) structures includes a substrate, a front end of the line (FEOL) stack formed on the substrate, a BEOL stack formed over the FEOL stack, and a patterned layer formed over the BEOL stack. A first conformal protection layer is formed on the patterned layer covering horizontal surfaces of a top surface and sidewalls of openings formed in the dielectric layer, and a second conformal protection layer is formed on the first conformal protection layer and on sidewalls of extended openings which extend below the patterned layer to a stop position, the first and second conformal protection layers forming an encapsulation boundary to protect at least the patterned layer and a portion of the BEOL stack.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
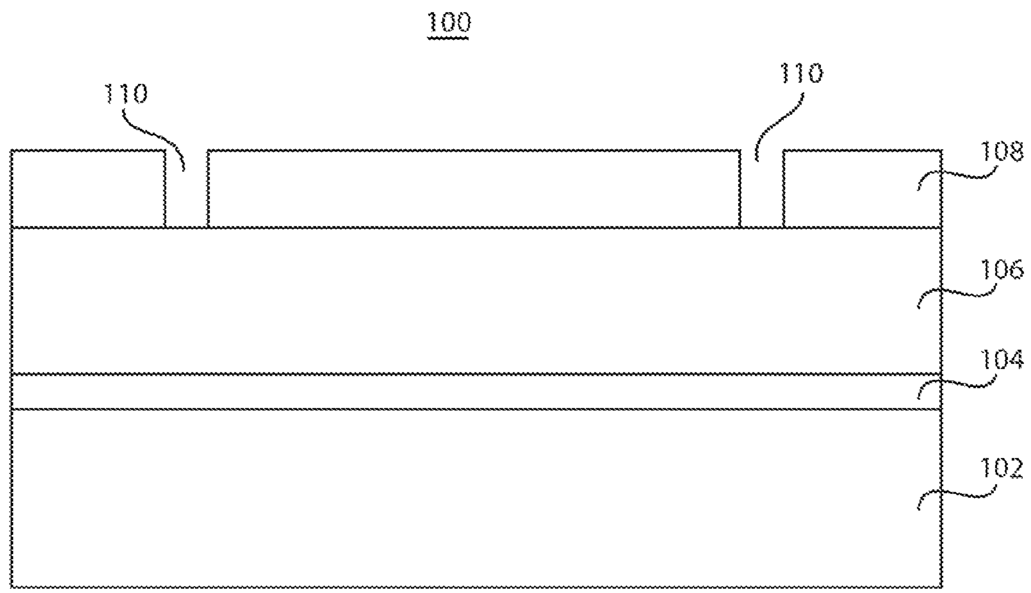
FIG. 1 is a cross-sectional view of a semiconductor device showing back end of the line (BEOL) or far BEOL structures including a patterned dielectric layer in accordance with the present principles.

In accordance with the present principles, methods and devices are provided, which include an encapsulation of back end of the line BEOL features to enable wet processing without concern for damage to the BEOL or far BEOL materials. This encapsulation is advantageously provided at relatively low temperatures, e.g., less than about 400 degrees C. (and preferably less than about 200 degrees C.) to prevent thermal damage to BEOL structures. This is especially true for FBEOL features, which often have an even more limited thermal budget. BEOL structures usually have better thermal resistance than FBEOL structures so relatively low temperatures become more of a concern.

In one embodiment, the encapsulation provides protection for horizontal and vertical surfaces. This is particularly useful in protecting sidewalls for vias and trenches which could otherwise be damaged by wet etch processing. Development of the process may include depositing a protection layer of, e.g., conformal oxide or nitride at a low temperature, over a sensitive material or feature, followed by resist lithography. Resist is coated, exposed and developed to acquire a desired pattern. An etch, e.g., a dry etch through the oxide layer, and at least part of the BEOL stack. The protection layer encapsulates the sensitive feature or layer.

The resist is stripped, and a second protection layer is formed, which is conformally deposited to encapsulate the BEOL stack. A directional etch etches the protection layers at the bottom of a trench to make an opening in the protection layer at the bottom of the recess to make a connection to the substrate, BEOL stack, FEOL stack, etc.

It is to be understood that the present invention will be described in terms of a given illustrative architecture having a substrate or handle; however, other architectures, structures, substrate materials and process features and steps may be varied within the scope of the present invention. In many embodiments, the substrate may include or be formed on a wafer. The wafer may include the formation of BEOL features. Certain BEOL processing may be performed on the wafer or after the wafer is diced into many chips.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Embodiments in accordance with the present principles may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw form (that is, as a single flexible substrate that has multiple structures formed thereon), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a structure 100 includes a semiconductor device that may be diced from a wafer or processed on the wafer. The structure 100 is illustratively divided up into zones for ease of explanation. Each zone may include conductive structures, device stacks or regions, etc. as will be explained in further detail below. Structure 100 includes a substrate (or wafer) 102. Substrate 102 may include a monocrystalline element or compound in which front end of the line (FEOL) devices are formed. In one embodiment, the substrate 102 includes a silicon substrate or "silicon handle"; however any suitable substrate material may be employed, e.g., Ge, SiGe, GaAs, InP, AlGaAs, InGaAs, etc.

A FEOL stack 104 is formed in or on the substrate 102. The FEOL stack 104 may include, e.g., transistor devices, diffusion regions, deep trench capacitors, plate capacitors, gate stacks, etc. The FEOL stack 104 is coupled to middle of line (MOL) structures, which in turn, are coupled to back end of the line (BEOL) features in a BEOL stack 106. MOL features will be assumed to be incorporated within one or more of the FEOL stack 104 and the BEOL stack 106 and are therefore not explicitly depicted in the FIGs.

The BEOL stack 106 includes metal lines, dielectric layers and other features, which connect to MOL contacts and the like. After BEOL stack 106 is completed, polyimide 108 or the like is deposited and patterned on the BEOL stack 106 to form openings for connections to other layers, e.g., substrate 102, FEOL stack 104, BEOL stack 106, etc. Patterning of the layer(s) 108 may include using lithographic processing to form openings or holes 110 or the polyimide is deposited as a pattern so that no lithography step is needed. The openings 110 preferably extend to the depth of the BEOL stack 106.

Figure 2:
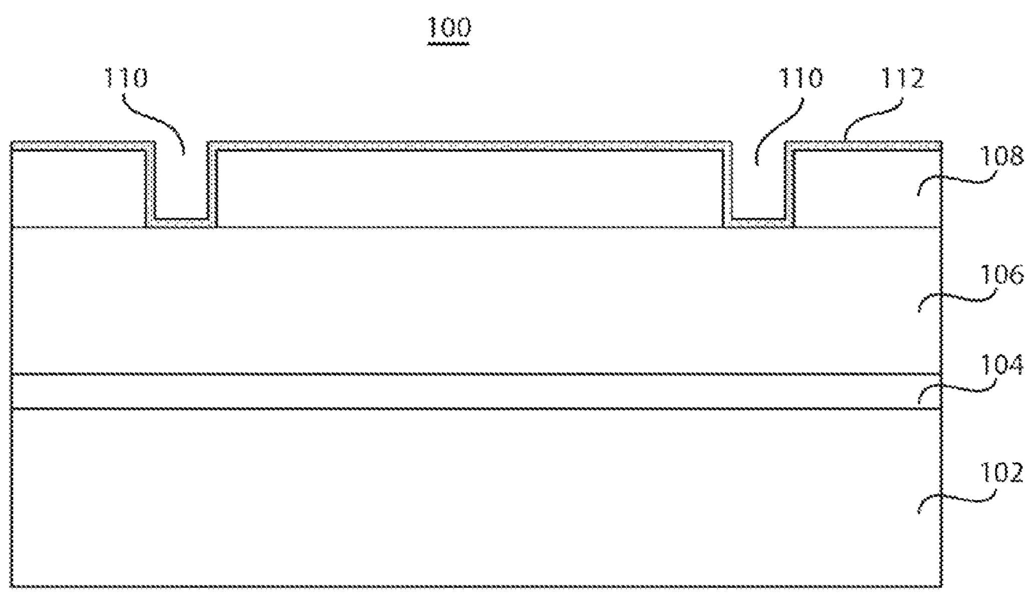
FIG. 2 is a cross-sectional view of the semiconductor device of FIG. 1 showing a first conformal protection layer formed in accordance with the present principles.

Referring to FIG. 2, a conformal protection layer 112 is deposited over horizontal and vertical surfaces of the dielectric layer 108 and on exposed areas of the BEOL stack 106. In one embodiment, the protection layer 112 includes a low temperature oxide (LTO), which is deposited at temperature below 400 degrees C. and preferably below 300 degrees C., and more preferably below 200 degrees C. Other materials may be employed for protection layer 112, e.g., nitride materials or the like. The protection layer 112 is deposited on both the horizontal and vertical sidewalls with a ratio of no more than 30:1 between horizontal to vertical deposition and preferably no more than 10:1.

Figure 3:
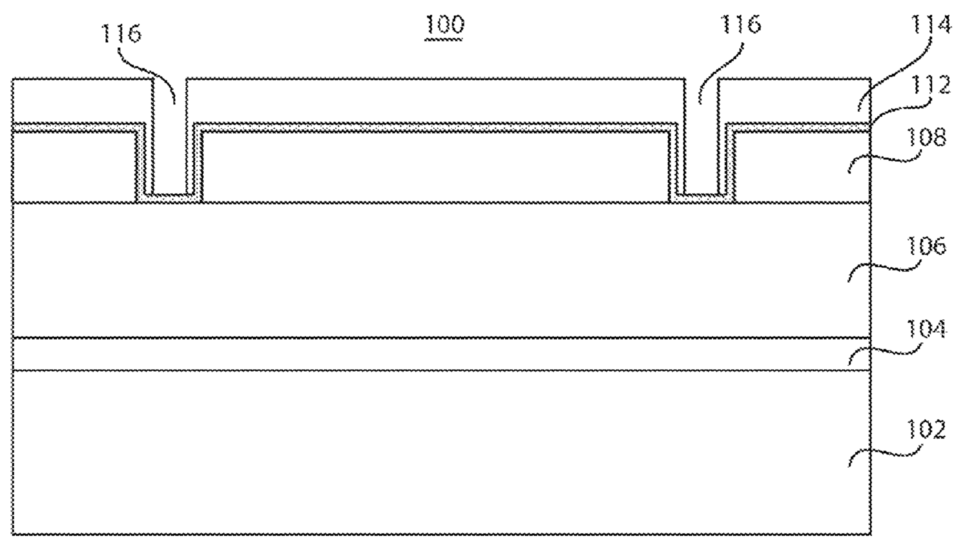
FIG. 3 is a cross-sectional view of the semiconductor device of FIG. 2 showing a resist layer patterned with openings corresponding to openings in the dielectric layer in accordance with the present principles.

Referring to FIG. 3, a resist layer 114 is spun onto a surface of the protection layer 112. The resist layer 114 fills in the openings 110 (FIG. 2). The resist layer 114 is processed using lithography. After the resist layer 114 is applied, the resist layer 114 is exposed through a mask (not shown). Exposure light (or electrons) through the mask cause the cross-linking (or avoid cross-linking) of the resist layer 114. Positive or negative resist materials may be employed. After the exposure, the resist layer 114 is developed to acquire a desired pattern. Development may include treating the resist layer 114 with chemicals to selectively remove one of the cross-linked or non-cross-linked resist material. The pattern may include openings 116 that can be etched to reach the protection layer 112 or may be developed down to the protection layer 112.

In one embodiment, the desired pattern of openings 116 includes feature sizes larger than about 50 nm and likely larger than 250 nm. The resist layer 114 may include a thickness of between about 50 nm and 50 microns and preferably between about 1 and 20 microns. The protection layer 112 advantageously lines a throat (sidewalls) of the openings 116 through a horizontal surface of material 108.

Figure 4:
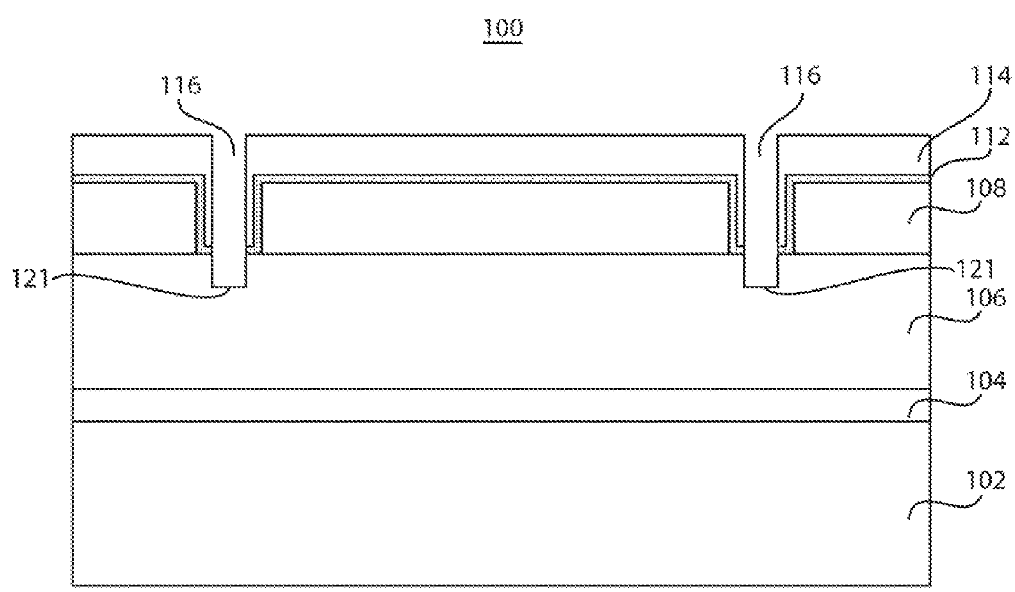
FIG. 4 is a cross-sectional view of the semiconductor device of FIG. 3 showing the resist layer as an etch mask employed to extend openings into a first position in the BEOL stack by etching in accordance with the present principles.

Referring to FIG. 4, using the resist layer 114 as an etch mask, an anisotropic etch, such as, e.g., a reactive ion etch (RIE) process, is performed to etch through the protection layer 112 and into the BEOL stack 106. In one embodiment, the etching may stop at position 121 and connections of other operations may be conducted at this position within the BEOL stack 106. During the etch process, the sensitive dielectric material 108 is protected by the resist layer 114 and the protection layer 112 along the sidewalls of the openings 116.

The etch is a directional etching and preferentially etches quickly in the vertical direction and much slower in the lateral direction. The vertical to lateral etch rate may be, e.g., at least 1.5:1 and preferably about least 5:1 (vertical:horizontal).

While FIG. 4 shows the openings 116 extending to the BEOL stack 106, the openings 116 may be stopped at any level below the protection layer 112 (e.g., below the layer 108 to BEOL stack 106 interface). The openings 116 may be employed to open up vias to provide access to conductive features in the structure 100. For example, the openings 116 may be employed for the deposition of a conductive material (not shown), which may be employed in the formation of contacts to the various levels of the device.

Figure 5:
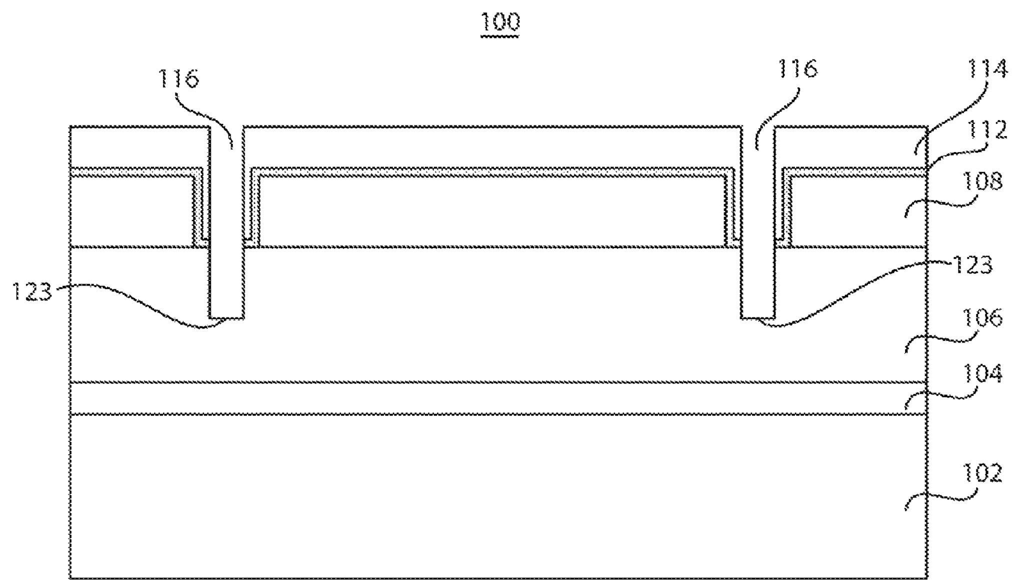
FIG. 5 is a cross-sectional view of the semiconductor device of FIG. 4 showing the openings extended into a second position in the BEOL stack by etching in accordance with the present principles.

Referring to FIG. 5, the directional etching may continue to provide greater depth to the openings 116. FIG. 5 shows the openings directionally etched down to a deeper position 123 within the BEOL stack 106.

Figure 6:
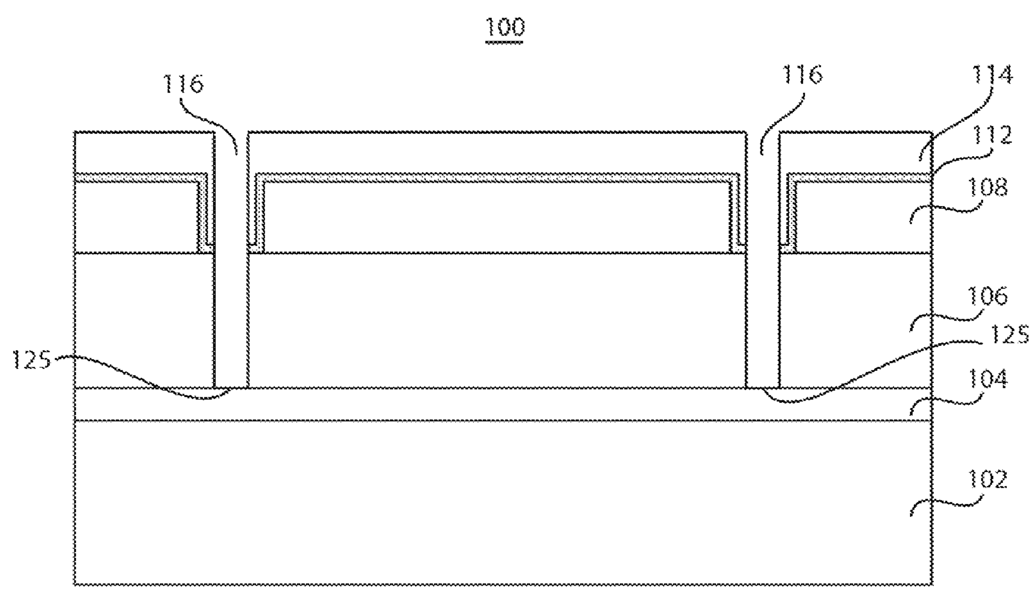
FIG. 6 is a cross-sectional view of the semiconductor device of FIG. 5 showing the openings extended to a front end of line (FEOL) stack by etching in accordance with the present principles.

Referring to FIG. 6, the directional etching may be further continued to reach the FEOL stack 104. The openings 116 are directionally etched down to a deeper position 125 through the BEOL stack 106 and onto or into the FEOL stack 104.

Figure 7:
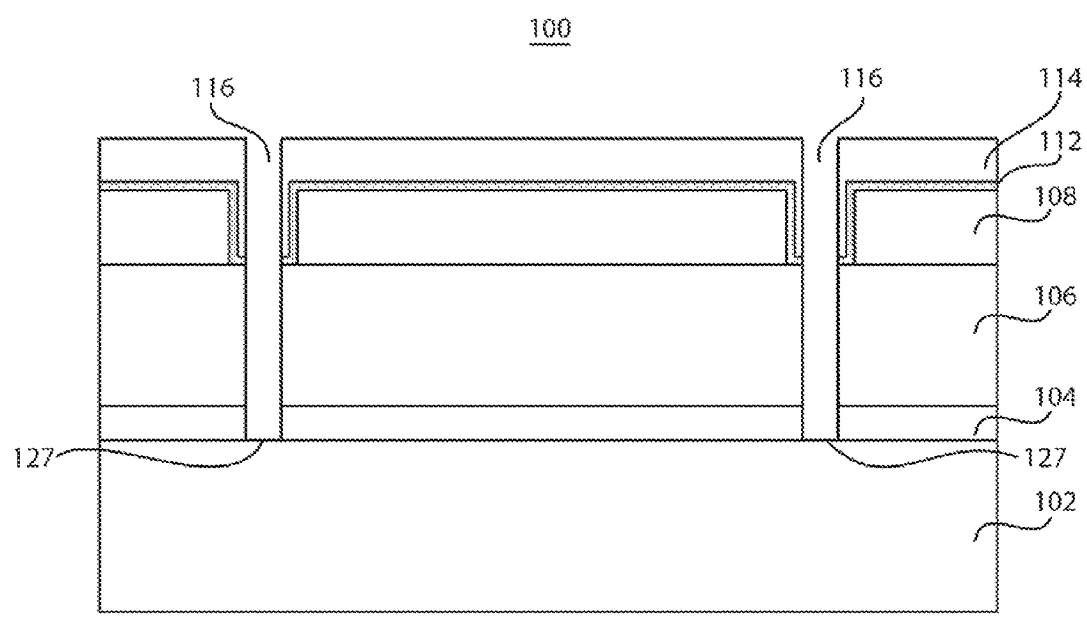
FIG. 7 is a cross-sectional view of the semiconductor device of FIG. 6 showing the openings extended to a substrate by etching in accordance with the present principles.

Referring to FIG. 7, in one embodiment, the directional etching is continued down to the substrate 102 through to reach the FEOL stack 104. The openings 116 are directionally etched down to a position 127 through the BEOL stack 106 and the FEOL stack 104. It should be noted that the etch chemistries may be altered during the etch process in accordance with the different layers being etched. A position where the etching is stopped will depend on the structure where a connection needs to be made. In different embodiments, the connection may be to a structure within the BEOL stack 106, the FEOL stack 104, and/or the substrate 102.

Figure 8:
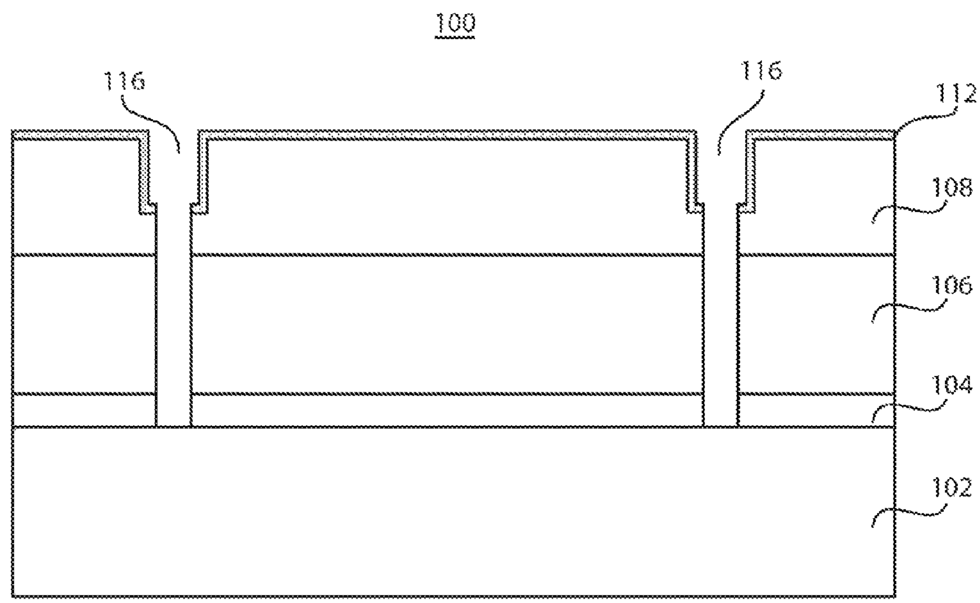
FIG. 8 is a cross-sectional view of the semiconductor device of FIG. 7 showing the resist layer stripped off in accordance with the present principles.

Referring to FIG. 8, the resist layer 114 is stripped off of the protection layer 112. The resist strip is performed after the etch and may employ known lithography techniques to remove the resist layer 114.

Figure 9:
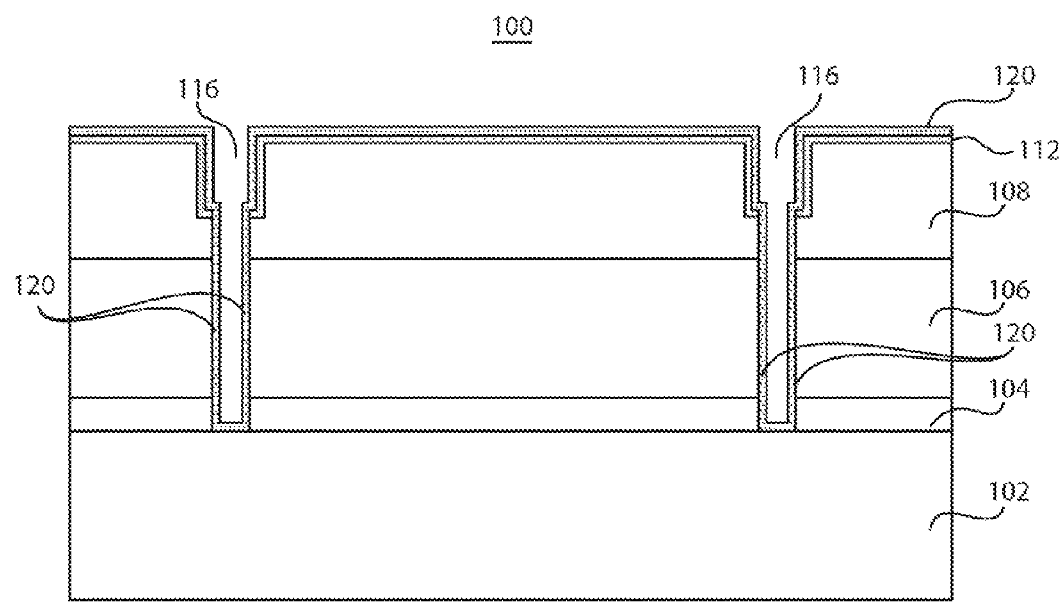
FIG. 9 is a cross-sectional view of the semiconductor device of FIG. 8 showing a second conformal protection layer formed in accordance with the present principles.

Referring to FIG. 9, a second protection layer 120 is formed over the protection layer 112 and along sidewalls of the openings 116. The second protection layer 120 may include LTO deposited at a temperature below 400 degrees C. and preferably below 300 degrees C. or even 200 degrees C. Other materials may be employed instead of or in addition to the LTO for the second protection layer 120. In one embodiment, a silicon nitride or silicon oxynitride, for example, may be employed to provide conformal coating and selective etching with respect to the protection layer 112 or other features (BEOL stack 106, etc.).

In one particularly useful embodiment, the second protection layer 120 includes LTO deposited on both the horizontal and vertical sidewalls with a ratio of no more than 30:1 between horizontal to vertical deposition and preferably no more than 10:1.

Figure 10:
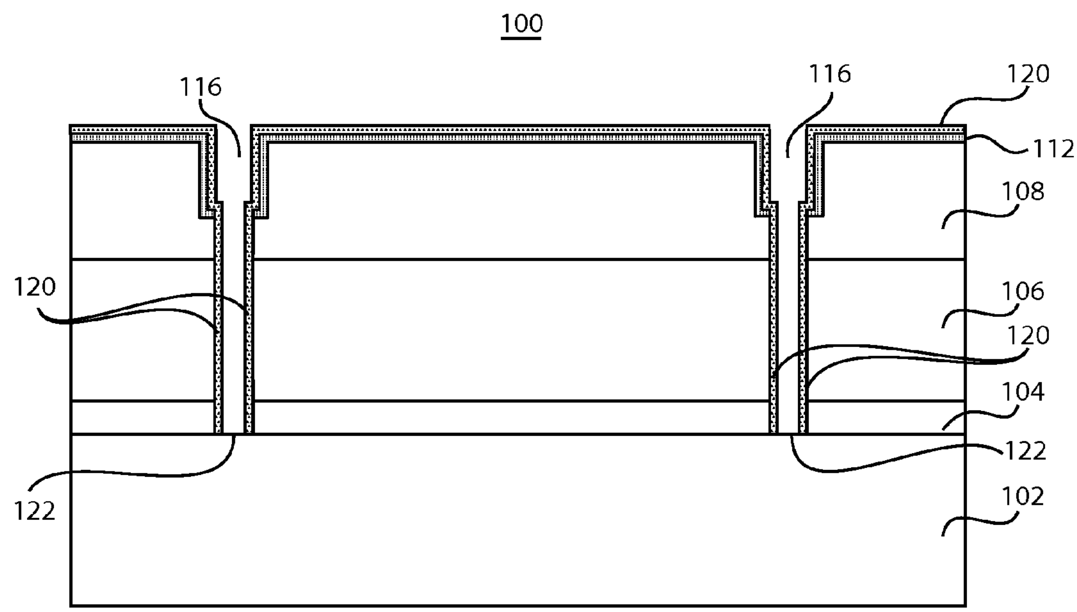
FIG. 10 is a cross-sectional view of the semiconductor device of FIG. 9 showing the second conformal protection layer opened up to expose the substrate in accordance with the present principles.

Referring to FIG. 10, a directional etching is performed to remove a portion of the second protection layer 120 at the bottom of the openings 116. The directional etching may include a RIE. In one embodiment, this opens up the second protection layer 120 to expose the substrate 102 at positions 122. However, it should be understood that the openings 116 may be stopped at other levels in the structure 100. The directional etching preferentially etches in the vertical direction with much slower etching in the lateral direction. The vertical to lateral etch rate may be at least 2:1 and preferably about 10:1.

In one embodiment, the substrate 102 may now be further etched using the protection layer 112 and the second protection layer 120 to protect the layer 108, BEOL stack 106 and FEOL stack 104. The substrate 102 may be etched using a wet etch including, e.g. potassium hydroxide (KOH) or tetramethylammonium hydroxide (TMAH or TMAOH). TMAH is a quaternary ammonium salt ($[(CH_3)_4N]^+[OH]^-$) that may be employed to anisotropically etch silicon. TMAH may also be employed as a solvent in the development of acidic photoresist in the photolithography process or employed in stripping photoresist. TMAH may be employed for low temperature etching (e.g., temperatures are between 70-90 degrees C.). Masking materials for long etches in TMAH include silicon dioxide and silicon nitride. Silicon nitride has a negligible etch rate in TMAH; the etch rate for silicon dioxide in TMAH varies with the quality of the film, but is generally on the order of 0.1 nm/minute.

Figure 11:
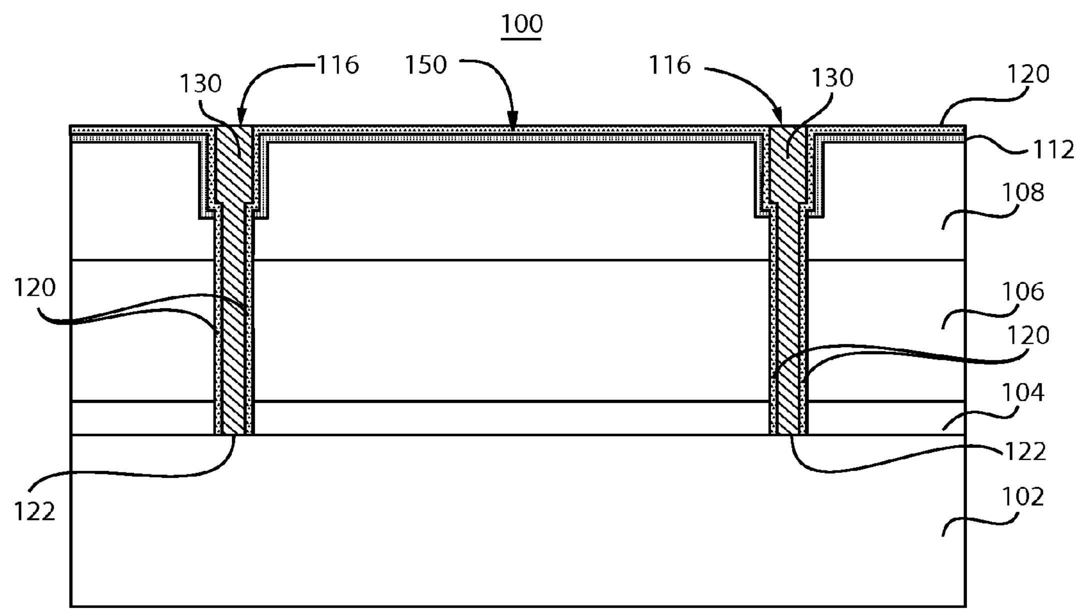
FIG. 11 is a cross-sectional view of the semiconductor device of FIG. 10 showing contacts formed over the second conformal protection layer to exposed portions of the substrate in accordance with the present principles.

Referring to FIG. 11, since BEOL materials (e.g., BEOL stack 106, etc.) and far back end of the line (FBEOL or far BEOL) materials (e.g., layer 108, etc.) are often porous and have poor resistance to wet etchants. The present principles provide an encapsulation boundary 150 that protects these sensitive materials during further processing. Hence, wet etching can now be employed in far BEOL processing. To allow wet etching in far BEOL processing, the encapsulation boundary 150 can be formed to protect one or more of the layer 108, the BEOL stack 106, the FEOL stack 104, and even the substrate 102.

The encapsulation boundary 150 permits vias or openings 116 to be processed using wet etching or other processing without risking damage to underlying devices and structures. In one embodiment, the openings 116 are filled with a conductive material to form contacts 130. The contacts 130 may be formed to any depth within the structure 100. The process of encapsulation may include an LTO layer or layers, which provide conformal coverage, low temperature formation and good etch resistance. Conformal deposition of LTO to encapsulate the stack(s) permits the use of process steps that were not normally possible. These process steps may include wet etching or other processes against which the far BEOL and BEOL materials were previously vulnerable.

Figure 12:
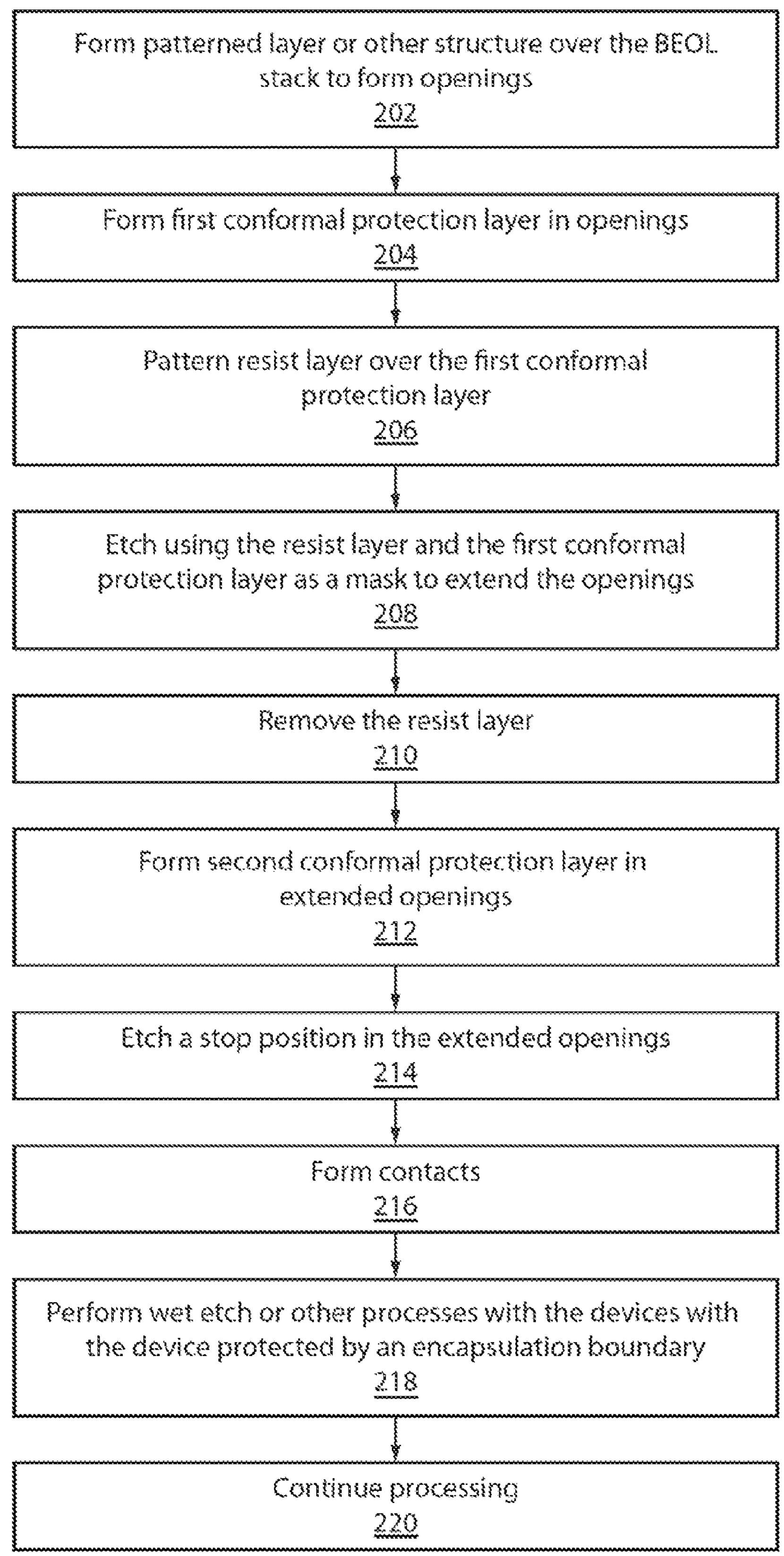
FIG. 12 is a block/flow diagram showing methods for protecting a semiconductor device in accordance with illustrative embodiments.

Referring to FIG. 12, a method for protection of a semiconductor device is illustratively shown. In block 202, a layer or other far BEOL structure is patterned over a back end of the line (BEOL) stack (e.g., patterned layer). The patterning may employ a formed pattern e.g., polyimide or may employ lithographic processing and form first openings in the dielectric layer. In block 204, a first conformal protection layer is deposited on the dielectric layer. The first conformal protection layer covers horizontal surfaces of a top surface and sidewalls of first openings formed in the dielectric layer. The first conformal protection layer may employ an oxide (or nitride) deposited at temperatures below 400 degrees C.

In block 206, a resist layer is patterned over the first conformal protection layer such that second openings in the resist layer correspond with the first openings in the dielectric layer. In block 208, the first conformal protection layer is etched through the first and second openings to form extended openings that reach a stop position. The stop position may include a position within the BEOL stack, a position within a front end of the line (FEOL) stack below the BEOL stack, a position to a substrate below a front end of the line (FEOL) stack and below the BEOL stack, etc. The etching of the first conformal protection layer may include an anisotropic etching process to break through the first conformal protection layer and extend the openings.

In block 210, the resist layer is removed or stripped off the stop surface to the first conformal protection layer. In block 212, a second conformal protection layer is deposited on the first conformal protection layer and on sidewalls of the extended openings to form an encapsulation boundary to protect at least the patterned layer and a portion of the BEOL stack. The second conformal protection layer may include an oxide or nitride deposited at temperatures below 400 degrees C.

In block 214, the second conformal protection layer is employed as an etch mask to etch, through the extended openings, to expose a surface at the etch stop position. In block 216, contacts may be formed through the extended openings to the surface at the stop position.

In block 218, wet etching or other steps may be performed during further processing such that the encapsulation boundary protects at least the patterned layer and the portion of the BEOL stack. In block 220, processing continues to complete the device.

Having described preferred embodiments for back end of the line (BEOL) stack encapsulation (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device having protected far back end of a line (FBEOL) structures, comprising:

a substrate;

a front end of a line (FEOL) stack formed on the substrate;

a back end of a line (BEOL) stack formed over the FEOL stack; and an encapsulation boundary conformally formed over the BEOL stack covering horizontal surfaces and sidewalls of extended openings which extend into at least the BEOL stack to a stop position to protect at least a portion of the BEOL stack.

2. The semiconductor device as recited in claim 1, wherein the encapsulation boundary includes a first conformal protection layer formed over and in openings of a patterned layer, the patterned layer being formed over the BEOL stack, the first conformal protection layer including a low temperature dielectric where low temperature is below 400 degrees C.

3. The semiconductor device as recited in claim 2, wherein the encapsulation boundary further includes a second conformal protection layer formed over the first conformal protection layer and on the sidewalls of the extended openings down to the stop position, the second conformal layer including a low temperature dielectric where low temperature is below 400 degrees C.

4. The semiconductor device as recited in claim 1, wherein the stop position includes a position within at least one of the BEOL stack; a front end of the line (FEOL) stack below the BEOL stack; and a substrate below the FEOL stack and below the BEOL stack.

5. The semiconductor device as recited in claim 1, further comprising a surface at the stop position exposed to permit contact with an underlying portion.

6. The semiconductor device as recited in claim 5, further comprising contacts formed through the extended openings to the underlying portion at the stop position.

7. The semiconductor device as recited in claim 1, wherein the encapsulation boundary is configured to protect at least the portion of the BEOL stack from at least wet etching.

* * * * *